United States Patent
Deguenther et al.

(10) Patent No.: US 10,151,929 B2
(45) Date of Patent: Dec. 11, 2018

(54) ILLUMINATION OPTICAL UNIT FOR PROJECTION LITHOGRAPHY AND HOLLOW WAVEGUIDE COMPONENT THEREFOR

(71) Applicant: Carl Zeiss SMT GmbH, Oberkochen (DE)

(72) Inventors: Markus Deguenther, Aalen (DE); Thomas Stammler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/385,289

(22) Filed: Dec. 20, 2016

(65) Prior Publication Data

US 2017/0102551 A1    Apr. 13, 2017

Related U.S. Application Data

(63) Continuation of application No. PCT/EP2015/071482, filed on Sep. 18, 2015.

(30) Foreign Application Priority Data

Sep. 23, 2014 (DE) .................. 10 2014 219 112

(51) Int. Cl.
*G03F 7/20* (2006.01)
*G02B 27/09* (2006.01)
(Continued)

(52) U.S. Cl.
CPC ....... *G02B 27/0994* (2013.01); *G02B 6/0096* (2013.01); *G02B 13/0095* (2013.01);
(Continued)

(58) Field of Classification Search
CPC .. G02B 6/0096; G02B 13/0095; G02B 13/16; G02B 26/0833; G02B 27/0994; G03F 7/70075; G03F 7/7015
(Continued)

(56) References Cited

U.S. PATENT DOCUMENTS 5,473,408 A * 12/1995 Hoffman ................ G02B 27/09
355/53
5,636,003 A 6/1997 Tanitsu et al.
(Continued)

FOREIGN PATENT DOCUMENTS

DE     195 20 563 A1   12/1996
DE  10 2010 030 089 A1   12/2011
(Continued)

OTHER PUBLICATIONS

International Search Report for corresponding PCT Appl No. PCT/EP2015/071482, dated Nov. 23, 2015.
(Continued)

*Primary Examiner* — Colin Kreutzer
(74) *Attorney, Agent, or Firm* — Fish & Richardson P.C.

(57) ABSTRACT

An illumination optical unit for projection lithography guides illumination light toward an object field and has a mirror array including a multiplicity of individual mirrors which are tiltable independently. A condenser optical unit transfers an arrangement plane of the mirror array into a pupil plane of the illumination optical unit. An optical hollow waveguide component of the illumination optical unit is upstream of the mirror array in the beam path of the illumination light and homogenizes and stabilizes an illumination light beam incident on the mirror array. An input coupling optical unit is upstream of the hollow waveguide component and couples an incident illumination light beam into the hollow waveguide component. A relay optical unit
(Continued)

images a beam exit surface of the hollow waveguide component onto the mirror array. The illumination optical unit is insensitive to light source instabilities.

23 Claims, 3 Drawing Sheets

(51) Int. Cl.
*F21V 8/00* (2006.01)
*G02B 13/00* (2006.01)
*G02B 13/16* (2006.01)
*G02B 26/08* (2006.01)

(52) U.S. Cl.
CPC ......... *G02B 13/16* (2013.01); *G02B 26/0833* (2013.01); *G03F 7/7015* (2013.01); *G03F 7/70075* (2013.01)

(58) Field of Classification Search
USPC ...................................... 355/67, 71; 385/133
See application file for complete search history.

(56) References Cited

U.S. PATENT DOCUMENTS

| | | |
|---|---|---|
| 6,456,362 B1 | 9/2002 | Banine |
| 6,552,846 B1 | 4/2003 | Suzuki |
| 6,771,870 B2 | 8/2004 | Strobl et al. |
| 2004/0246456 A1 | 2/2004 | Coleman |
| 2005/0213333 A1 | 9/2005 | Liu |
| 2006/0227424 A1 | 10/2006 | Wang et al. |
| 2006/0227676 A1 | 10/2006 | Tanaka |
| 2009/0021715 A1 | 1/2009 | Deguenther et al. |
| 2010/0195077 A1 | 8/2010 | Koehler et al. |
| 2010/0283985 A1 | 11/2010 | Layh et al. |
| 2013/0044301 A1* | 2/2013 | Zlatanov ............ G02B 26/0833 355/67 |
| 2013/0077076 A1 | 3/2013 | Patra et al. |
| 2013/0094221 A1 | 4/2013 | Goletz et al. |
| 2015/0331330 A1* | 11/2015 | Markle ............... G03F 7/70291 355/71 |
| 2015/0362660 A1* | 12/2015 | Wald .................. G02B 27/0994 250/227.11 |

FOREIGN PATENT DOCUMENTS

| | | |
|---|---|---|
| DE | 10 2010 026 252 A1 | 1/2012 |
| EP | 0 230 931 A2 | 8/1987 |
| EP | 0 691 552 A2 | 1/1996 |
| JP | H06-196389 | 7/1994 |
| JP | 2001-110713 | 4/2001 |
| JP | 2004-363448 | 12/2004 |
| JP | 2006-293346 | 10/2006 |
| JP | 2007-505488 | 3/2007 |
| JP | 2013-530534 | 7/2013 |
| WO | WO 2005/026843 A2 | 3/2005 |
| WO | WO 2007/093433 A1 | 8/2007 |
| WO | WO 2008/071275 A1 | 6/2008 |
| WO | WO 2011/157601 A2 | 12/2011 |
| WO | WO 2014139881 A1 * | 9/2014 ......... G02B 27/0994 |

OTHER PUBLICATIONS

Japanese office action, with English translation, for corresponding JP Appl No. 2017-516 112, dated Dec. 19, 2017.
German Office Action, with translation thereof, for corresponding DE Appl No. 10 2014 219 112.2, dated Mar. 2, 2015.

* cited by examiner

ILLUMINATION OPTICAL UNIT FOR PROJECTION LITHOGRAPHY AND HOLLOW WAVEGUIDE COMPONENT THEREFOR

CROSS-REFERENCE TO RELATED APPLICATIONS

The present application is a continuation of, and claims benefit under 35 USC 120 to, international application PCT/EP2015/071482, filed Sep. 18, 2015, which claims benefit under 35 USC 119 of German Application No. 10 2014 219 112.2, filed Sep. 23, 2014. The entire disclosure of international application PCT/EP2015/071482 and German Application No. 10 2014 219 112.2 are incorporated by reference herein.

FIELD

The disclosure relates to an illumination optical unit for projection lithography for guiding illumination light of a light source toward an object field, in which an object to be imaged is arrangeable. Furthermore, the disclosure relates to a hollow waveguide component for such an illumination optical unit, an optical system and an illumination system including such an illumination optical unit, a projection exposure apparatus including such an optical system, a method for producing a microstructured or nanostructured component using such a projection exposure apparatus, and a microstructured or nanostructured component produced via this method.

BACKGROUND

An illumination optical unit is known from WO 2011/157601 A2 and U.S. 2010/0283985 A1.

SUMMARY

The present disclosure seeks to provide an illumination optical unit that is insensitive to light source instabilities.

According to the disclosure, an illumination optical unit for projection lithography for guiding illumination light of a light source toward an object field, in which an object to be imaged is arrangeable includes: a mirror array including a multiplicity of individual mirrors which are tiltable independently of one another by an actuator system and are connected to associated tilting actuators; an optical hollow waveguide component, which is disposed upstream of the mirror array in the beam path of the illumination light, for homogenizing and stabilizing an illumination light beam incident on the mirror array; an input coupling optical unit disposed upstream of the hollow waveguide component and serving for coupling an incident illumination light beam into the hollow waveguide component; and a relay optical unit for imaging a beam exit surface of the hollow waveguide component onto the mirror array.

The hollow waveguide component according to the disclosure, which is arranged upstream of the mirror array, provides for homogenizing and stabilizing the illumination light beam incident on the mirror array. The desired properties for the mirror array itself for generating predefined illumination parameters within narrow tolerances are significantly relaxed on account of the stabilizing and homogenizing function of the upstream hollow waveguide component. In particular, a mirror array including fewer than 10 000 individual mirrors can be used. The light mixing in the hollow waveguide component can take place with a very low etendue. The etendue can typically be in the range of between $1 \times 10^{-10}$ sr m$^2$ and $1 \times 10^{-8}$ sr m$^2$, in particular in the range of between $1 \times 10^{-10}$ sr m$^2$ and $1 \times 10^{-9}$ sr m$^2$. A random phase element (RPE) can be arranged between the primary light source and the optical hollow waveguide component, the random phase element supporting light mixing even in the phase space, thus resulting, in particular, in a desirably low sensitivity of the illumination optical unit toward mode instabilities of the light source. The random phase element can be arranged in a plane of the illumination optical unit that is optically conjugate with respect to the light source. For this purpose, an optical unit that ensures that an arrangement plane of the random phase element constitutes and optically conjugate plane of the light source can be arranged between the light source and the random phase element.

The illumination optical unit can have a condenser optical unit for transferring an arrangement plane of the mirror array into a pupil plane of the illumination optical unit. However, such a condenser optical unit is not mandatory.

The illumination optical unit can be arranged such that an internal reflection angle of the illumination light in the hollow waveguide component is greater than 85°. This can enable a hollow waveguide component through which the illumination light passes with very low losses. It is possible to achieve throughput values of the illumination light through the hollow waveguide component that are greater than 90%. The internal reflection angle can be greater than 88°, for example.

The hollow waveguide component can have a ratio of waveguide length to waveguide cross section of at least 100. This can enable a sufficiently high number of internal reflections in the hollow waveguide component and thus a good intermixing of the illumination light, which leads to a corresponding homogenization and stabilization.

The hollow waveguide component can have a rectangular waveguide cross section. This can be advantageous with regard to the manufacture of the hollow waveguide component. The waveguide cross section can be square, in particular. An aspect ratio of rectangular dimensions of a rectangular waveguide cross section can correspond to an aspect field of a surface to be illuminated, that is to say of a mirror array surface to be illuminated.

The hollow waveguide component can be produced from at least two (e.g., four) separate component parts, of which each component part delimits at least one internal reflection surface of the hollow waveguide component.

This can be particularly suitable for manufacture. Optionally, the hollow waveguide component can be composed of four at least partly reflectively coated mirror parallelepipeds. This can be particularly advantageous, wherein, in particular identically constructed mirror parallelepipeds can be used in this case. As mirror parallelepipeds of this type, it is possible to use component parts which are already known in this form or a similar form in rod illumination systems described for example in US 2010/0283985 A1 and DE 195 20 563 A1. In contrast to the known rod illumination systems, the mirror surfaces of the mirror parallelepipeds in the case of the hollow waveguide component are not used for reflection at the optically less dense medium, but rather for reflection at the optically denser medium.

The relay optical unit can have a magnifying imaging scale of at least 10. Such an imaging scale of the relay optical unit can be adapted well to typical component dimensioning.

The relay optical unit can have more than one (e.g., two or four) lens element. The embodiment including four lens elements, in particular, can allow the predefinition of an advantageously large working distance between the beam exit surface and a first lens element of the relay optical unit, such that a power density of the illumination light which is incident on the first lens element is sufficiently low.

The advantages of a hollow waveguide component described herein correspond to those which have already been explained above with reference to the illumination optical unit.

An optical system can include an illumination optical unit described herein and a projection optical unit for imaging the object field into an image field in an image plane, in which a substrate is arrangeable, onto which imaging is effected during the projection exposure. A projection exposure apparatus can include such an optical system and a light source for generating the illumination light. A method can include microlithographically producing microstructured or nanostructured components using such a projection exposure apparatus. A component can be produced by such methods. Advantages of such an optical system, an illumination system, a projection exposure apparatus, a production method, and a component correspond to those which have already been explained above with reference to the illumination optical unit. The microstructured or nanostructured component is a semiconductor component, in particular a microchip, for example a very large scale integrated memory chip.

BRIEF DESCRIPTION OF THE DRAWINGS

Exemplary embodiments of the disclosure are explained in greater detail below with reference to the drawings, in which.

DESCRIPTION OF EXEMPLARY EMBODIMENTS

Figure 1:
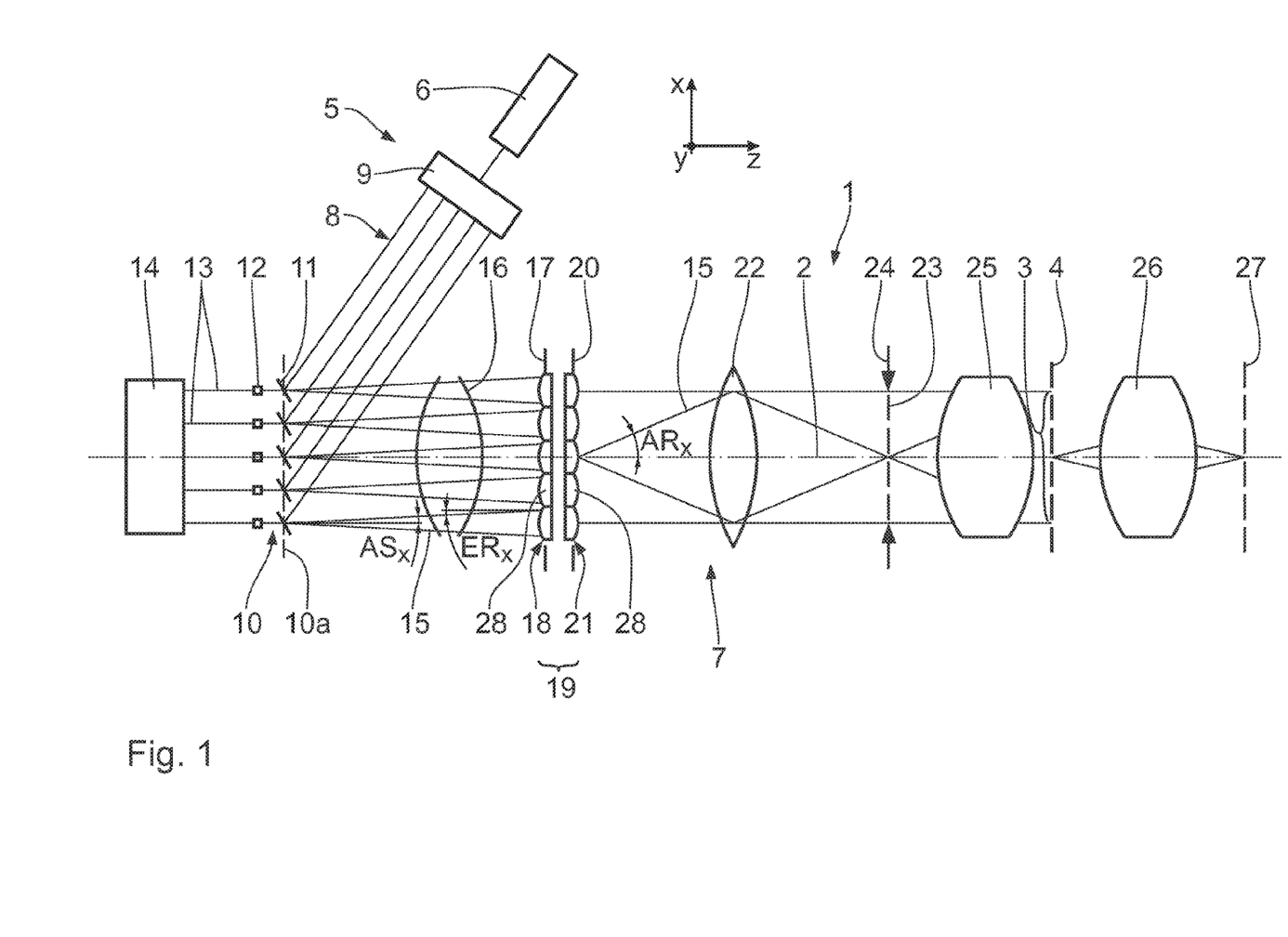
FIG. 1 schematically shows a meridional section through an illumination system according to the disclosure within a microlithographic projection exposure apparatus including an illumination optical unit including a mirror array with tilting actuators driven via a controller, and a raster module including a two-stage raster arrangement.

FIG. 1 schematically shows a microlithographic projection exposure apparatus 1, which is embodied as a wafer scanner and is used in the production of semiconductor components and other finely structured components. The projection exposure apparatus 1 operates with light from the deep ultraviolet range (DUV or VUV), in particular, in order to achieve resolutions down to fractions of micrometers.

In order to facilitate the description of positional relationships, a Cartesian xyz-coordinate system is depicted in the drawing. The x-direction runs upward in FIG. 1. In FIG. 1, the y-direction runs perpendicularly to the plane of the drawing and out of the latter. In FIG. 1, the z-direction runs toward the right.

A scanning direction of the projection exposure apparatus 1 runs in the y-direction, that is to say perpendicular to the plane of the drawing in FIG. 1. In the meridional section illustrated in FIG. 1, the plurality of optical components of the projection exposure apparatus 1 are lined up along an optical axis 2 running in the z-direction. It goes without saying that it is also possible for the optical axis 2 to be folded differently than is shown in FIG. 1, in particular in order to fashion the projection exposure apparatus 1 compactly.

An illumination system of the projection exposure apparatus 1, which illumination system is designated by 5 overall, serves for the defined illumination of an object field or illumination field 3 in an object or reticle plane 4, in which a structure to be transferred in the form of a reticle (not illustrated in more detail) is arranged. The illumination system 5 includes a primary light source 6 and an illumination optical unit 7 having the optical components for guiding illumination light or imaging light 8 toward the object field 3. The primary light source 6 is an excimer laser, in particular an ArF laser having an operating wavelength of 193 nm, the illumination light beam of which is aligned coaxially with respect to the optical axis 2. Other UV light sources, for example an $F_2$-excimer laser having an operating wavelength of 157 nm, a Krf excimer laser having an operating wavelength of 248 nm, and primary light sources having longer or shorter operating wavelengths are likewise possible.

A beam of the illumination light 8 having a small rectangular cross section, the beam coming from the light source 6, firstly impinges on a homogenizing optical unit 9, which generates an emerging beam of the illumination light 8 including largely parallel light and having a larger rectangular cross section. The homogenizing optical unit 9 can contain elements that reduce undesired effects of the coherence of the illumination light 8. Details of the homogenizing optical unit 9, which is merely indicated in FIG. 1 and which serves not only for homogenizing but also for stabilizing an illumination light beam, will be discussed below in particular with reference to FIG. 2.

The illumination light 8, largely parallelized downstream of the homogenizing optical unit 9, subsequently impinges on a micromirror array (MMA) 10 for generating an illumination light angular distribution. The micromirror array 10 has a multiplicity of rectangular individual mirrors 11 arranged in an xy-raster. Each of the individual mirrors 11 is connected to an associated tilting actuator 12. Each of the tilting actuators 12 is connected via a control line 13 to a controller 14 for driving the actuators 12. The actuators 12 can be driven independently of one another via the controller 14. Each of the actuators 12 can set a predefined x-tilting angle (tilting in the xz-plane) and, independently thereof, a y-tilting angle (tilting in the yz-plane) of the individual mirror 11 such that an angle $AS_x$ of reflection of an illumination light partial beam 15 reflected from the associated individual mirror 11 in the xz-plane and correspondingly an angle $AS_y$ of reflection (not illustrated in the drawing), in the yz-plane can be predefined.

The angular distribution—generated by the MMA 10—of angles AS of reflection of the illumination light partial beams 15 is converted into a two-dimensional illumination light intensity distribution, that is to say illumination light intensity distribution that is location-dependent perpendicularly to the optical axis 2, upon passing through a Fourier lens element arrangement or a condenser 16 positioned at the distance of its focal length from the MMA 10. The condenser 16 serves for transferring an arrangement plane 10a of the MMA 10 into a pupil plane of the illumination optical unit 7. The intensity distribution thus generated is therefore present in a first illumination plane 17 of the illumination system 5. Together with the Fourier lens element arrangement 16, the MMA 10 thus constitutes a light distribution device for generating a two-dimensional illumination light intensity distribution.

A first raster arrangement 18 of a raster module 19, which is also referred to as fly's eye condenser or honeycomb condenser, is arranged in the region of the first illumination plane 17. Angles of incidence $ER_x$ in the xz-plane (cf. FIG. 1), and $ER_y$ in the yz-plane (not illustrated in the drawing), of the illumination light 8 on the raster module 19 are correlated with the angles of reflection $AS_x$ (cf. FIG. 1), $AS_y$ (not illustrated in the drawing), of the illumination light partial beams 15 from the MMA 10 and/or the location from which the respective illumination light partial beam 15 emerges from the MMA 10, that is to say the respective individual mirror 11. This correlation is predefined by the Fourier lens element arrangement 16. With the use of a Fourier lens element arrangement 16, that is to say not a condenser, the locations of incidence of the illumination light partial beams 15 on the first raster arrangement 18 are directly correlated with the angles of reflection $AS_x$, $AS_y$ of the illumination light partial beams 15 from the MMA 10, since the Fourier lens element arrangement 16 approximately results in a conversion of angles into spatial coordinates. Both with the use of a Fourier lens element arrangement 16 and with the use of a condenser 16, the angles of incidence $ER_x$, $ER_y$ of the illumination light partial beams 15 on the raster module 19 are directly correlated with the positions of the illumination light partial beams 15 on the MMA 10, that is to say with the individual mirror 11 from which the respective illumination light partial beam 15 emerges, since both the use of a Fourier lens element arrangement 16 and the use of a condenser 16 result in a conversion of spatial coordinates into angles.

The raster module 19 serves for generating a spatially distributed arrangement of secondary light sources, that is to say of images of the primary light source 6, and thus for generating a defined illumination angle distribution of the illumination light emerging from the raster module 19.

A second raster arrangement 21 is arranged in a further illumination plane 20. The illumination plane 17 is situated in or in the vicinity of a front focal plane of individual elements of the second raster arrangement 21. The two raster arrangements 18, 21 constitute a fly's eye condenser or honeycomb condenser of the illumination optical unit 7. The further illumination plane 20 is a pupil plane of the illumination system 5 or is adjacent to a pupil plane of the illumination system 5. The raster module 19 is therefore also referred to as a field defining element (FDE).

Angles of reflection $AR_x$ in the xz-plane (cf. FIG. 1) and $AR_y$ in the yz-plane (not illustrated in the drawing), at which the illumination light partial beams 15 leave the second raster arrangement 21, are unambiguously assigned to a spatial region in the object field 3 on which the respective illumination light partial beam 15 impinges on the object field 3.

A further condenser 22 is disposed downstream of the raster module 19, the further condenser also being referred to as a field lens element. Together with the second raster arrangement 21, the condenser 22 images the first illumination plane 17 into a field intermediate plane 23 of the illumination system 5. A reticle masking system (REMA) 24 can be arranged in the field intermediate plane 23, and serves as an adjustable shading stop for generating a sharp edge of the illumination light intensity distribution. A downstream lens 25 images the field intermediate plane 23 onto the reticle, that is to say the lithography original, situated in the reticle plane 4. Via a projection lens 26, the reticle plane 4 is imaged onto a wafer or image plane 27 onto the wafer (not illustrated in FIG. 1), which is displaced intermittently or continuously in the scanning direction (y).

The first raster arrangement 18 and the second raster arrangement 21 in each case have individual raster elements 28 arranged in columns and rows in the xy-plane. The raster elements 28 have a rectangular aperture having an x/y aspect ratio of 1/1, for example. Other, in particular higher, x/y aspect ratios of the raster elements 28, for example 2/1, are also possible.

The meridional section according to FIG. 1 passes along a raster column. The raster elements 28 are embodied as microlens elements, e.g. having a positive refractive power. The raster elements 28 are arranged in a manner directly adjoining one another, that is to say substantially in an area-filling manner, in a raster corresponding to their rectangular shape. The first raster elements 28 of the first raster arrangement 18 are also designated as field honeycombs and the second raster elements 28 of the second raster arrangement 21 are also designated as pupil honeycombs.

The raster construction and the function of the raster module 19 correspond, in principle, to the description given in WO2007/093433 A1.

Figure 2:
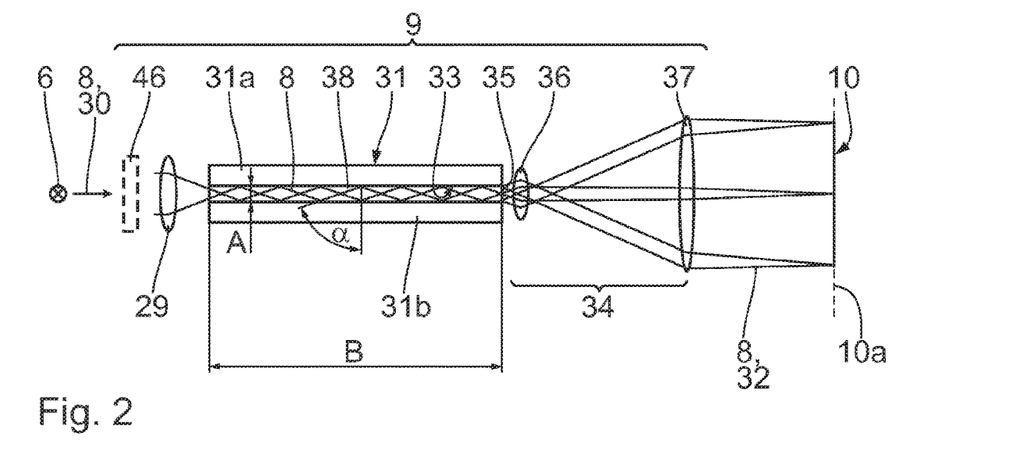
FIG. 2 shows an excerpt from the beam path of the illumination system from FIG. 1 between a primary light source and the mirror array, including a homogenizing optical unit having an optical hollow waveguide component.

FIG. 2 shows the beam path of the illumination light 8 between the primary light source 6 and the MMA 10 in more specific detail. The homogenizing optical unit 9 firstly has an input coupling optical unit 29 in the form of an input coupling lens element in the beam path of the illumination light 8 downstream of the primary light source 6. The lens element 29 can be embodied as a planoconvex lens. Upstream of the input coupling optical unit 29, an incident illumination light beam 30 has a typical diameter of 25 mm and a typical divergence of 2 mrad.

The input coupling optical unit 29 serves for coupling the illumination light beam 30 into an optical hollow waveguide component 31. The latter serves for homogenizing and stabilizing an illumination light beam 32 of the illumination light 8 impinging on the MMA 10. The hollow waveguide component 31 is embodied as a hollow rod. A power density of the illumination light 8 upon entering the hollow waveguide component 31 is greater than 10 $kW/cm^2$, for example.

A typical cross-sectional dimension A of the hollow waveguide of the hollow waveguide component 31 is 1 mm. A typical lens B of the waveguide of the hollow waveguide component is 500 mm. A ratio B/A of waveguide length B to waveguide cross section A is thus 500 in the case of the embodiment described, which is reproduced in a manner not to scale in FIG. 2. A different ratio B/A of at least 100 is also possible, for example ratio values B/A of 150, 200, 250, 300, 350, 400, 450, or a ratio even greater than 500, for example a ratio B/A of 600, 750, 900, 1000, 1500, 2000, or an even greater ratio.

A cavity 33 of the waveguide of the hollow waveguide component 31, in which the illumination light 8 is guided by multiple reflection, has a rectangular waveguide cross section and, in the embodiment described, a square waveguide cross section. An internal angle $\alpha$ of incidence of the illumination light 8 on reflection surfaces of the waveguide that delimit the cavity 33 is greater than 85° and, in the embodiment described, is 88°, which is illustrated in a manner not to scale in FIG. 2. A larger internal reflection angle or angle of incidence $\alpha$ is also possible, for example 86°, 88°, 89°, or an even larger angle of incidence.

On account of the multiple reflection of the illumination light 8 in the hollow waveguide component 31, this results in a homogenization and also a stabilization of an intensity distribution of the illumination light 8 over the beam exit surface 35.

The number of reflections of the illumination light 8 at the reflection surfaces of the cavity 33 can be greater than 5 and is in particular greater than 10.

A relay optical unit 34 for the magnified imaging of a beam exit surface 35 of the hollow waveguide component 31 onto the MMA 10 is disposed downstream of the hollow waveguide component 31. In the case of the embodiment according to FIG. 2, the relay optical unit is embodied in the manner of a Kepler telescope having an imaging scale β=50. Depending on the size ratios between the waveguide cross section A, that is to say the typical extents of the beam exit surface 35, and the area to be impinged on by the illumination light 8 on the MMA 10, it is also possible to realize a different imaging scale β in the range of between 10 and 500, for example β equal to 20, 25, 30, 40, 60, 75, 100 or 200.

The relay optical unit 34 according to FIG. 2 has two lens elements 36, 37, each having a positive refractive power. The lens elements 36, 37 can be embodied as planoconvex lens elements.

The hollow waveguide component 31 can be manufactured monolithically. Alternatively, the hollow waveguide component 31 can be manufactured from at least two separate component parts, of which each component part delimits at least one internal reflection surface 38 of the hollow waveguide component 31. The portions 31a, 31b of the hollow waveguide component 31 that are depicted sectionally above and below the cavity 33 in the longitudinal section in FIG. 2 can thus be two separate component parts. During the assembly of these component parts 31a, 31b, the component parts 31a, 31b are brought together such that the waveguide, that is to say the reflective cavity 33, is produced seamlessly.

Figure 3:
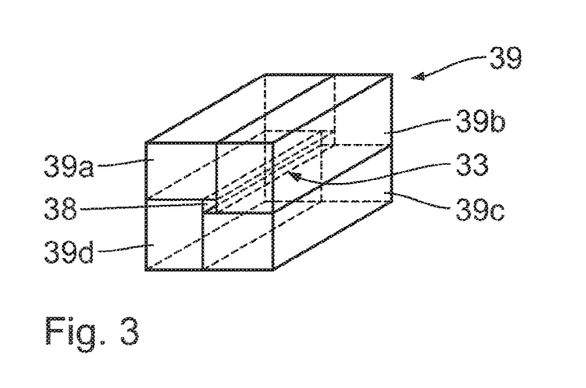
FIG. 3 shows an embodiment for the hollow waveguide component according to FIG. 2.

FIG. 3 shows a further embodiment of a hollow waveguide component 39 that can be used instead of the hollow waveguide component 31. Components and functions corresponding to those which have already been explained above with reference to the hollow waveguide component 31 bear the same reference signs and will not be discussed in detail again.

The hollow waveguide component 39 is constructed from four separate component parts 39a, 39b, 39c and 39d, of which each component part 39a to 39d delimits an internal reflection surface 38 of the cavity 33. The component parts 39a to 39d are mirror parallelepipeds including main bodies composed of a glass or quartz material, for example composed of $SiO_2$, the mirror parallelepipeds being partly reflectively coated in the region of the internal reflection surface 38. The component parts 39a to 39d each have the identical construction encompassing the parallelepiped dimensions and the relative position of the partial reflective coating of the internal reflection surface 38. Alternatively, an entire side surface of the respective mirror parallelepiped 39a to 39d, which side surface includes the internal reflection surface 38, can be reflectively coated so as to be highly reflective for the illumination light 8. During the assembly of the hollow waveguide component 31, the four mirror parallelepipeds 39a to 39d are placed onto one another seamlessly, as reproduced in FIG. 3, such that, on account of the dimension difference in the parallelepiped width dimensions, centrally the cavity 38, which has a square waveguide cross section in this case, too, arises seamlessly.

The number of reflections of the illumination light 8 at the internal reflection surfaces 38 can be greater than 5 and is in particular greater than 10.

The mirror parallelepipeds 39a to 39d can be braced against one another in a common mount or can be adhesively bonded to one another.

Figure 4:
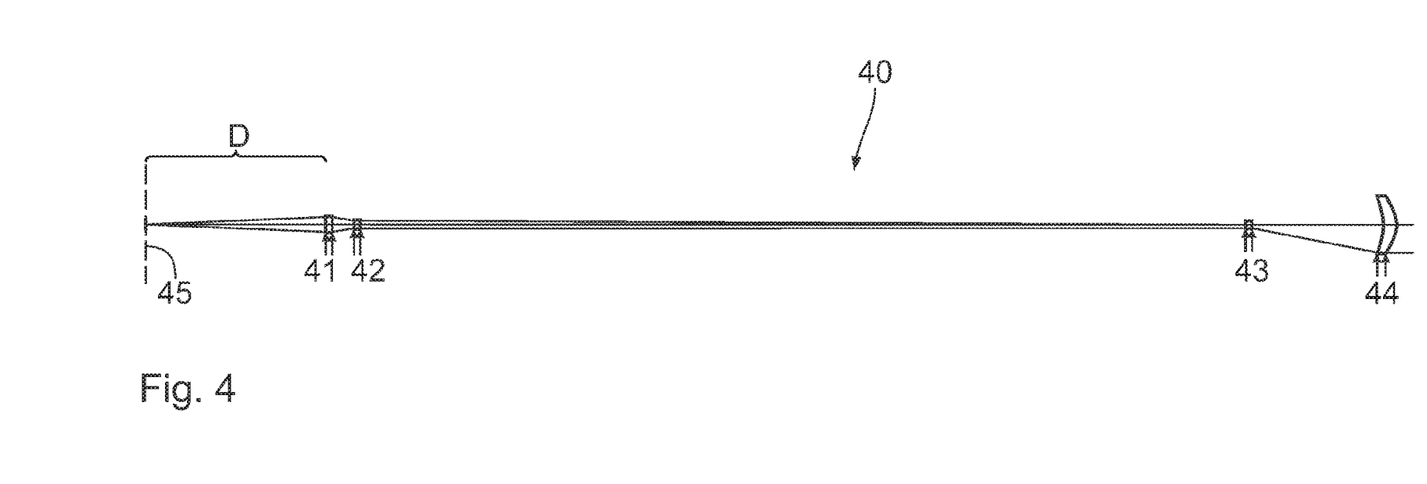
FIG. 4 shows an embodiment for a relay optical unit between the hollow waveguide component and the mirror array.

FIG. 4 shows a further embodiment of a relay optical unit 40 that can be used instead of the relay optical unit 34. Components and functions corresponding to those which have already been explained above with reference to the relay optical unit 34 bear the same reference signs and will not be discussed in detail again.

Instead of two lens elements, the relay optical unit 40 has a total of four lens elements 41, 42, 43 and 44. The relay optical unit 40, like the relay optical unit 34, also has an imaging scale of β=50.

A distance D between the first lens element 41 in the beam path of the illumination light 8 and an arrangement plane 45 of the beam exit surface 35 for example of the hollow waveguide component 31, in the case of the relay optical unit 40, is significantly greater than in the case of the relay optical unit 34 and is in particular greater than 30 mm.

The following table reproduces optical design data of the relay optical unit 40. The relay optical unit 40 is designed for a design wavelength of 193 nm.

TABLE 1

| Surface No. | Radius [mm] | Thickness [mm] | Glass |
|---|---|---|---|
| Object plane 45 | 0 | 275.415156 | |
| Entrance surface of lens element 41 | 73.70347 | 10 | CAF2HL |
| Exit surface of lens element 41 | −94.793637 | 32.329931 | |
| Entrance surface of lens element 42 | −80.344478 | 10 | CAF2HL |
| Exit surface of lens element 42 | 99.699746 | 1354.71268 | |
| Entrrance surface of lens element 43 | −43.164472 | 10 | CAF2HL |
| Exit surface of lens element 43 | 35.968135 | 200.480306 | |
| Entrance surface of lens element 44 | −89.938872 | 20.048296 | CAF2HL |
| Exit surface of lens element 44 | −58.8781 | 25 | |
| Image plane 10a | 0 | | |

TABLE 2a

| | | | κ | c1 |
|---|---|---|---|---|
| Lens element 41 | Convex Concave | Asphere | 2.59E+00 | −1.42E−06 |
| Lens element 42 | Concave Concave | | | |
| Lens element 43 | Concave concave | | | |
| Lens element 44 | Concave convex | Asphere | −3.97E−03 | 1.73E−07 |

TABLE 2b

|  |  |  | c2 | c3 | c4 |
|---|---|---|---|---|---|
| Lens element 41 | convex concave | Asphere | −3.12E−10 | −1.06E−12 | 2.63E−15 |
| Lens element 42 | concave concave |  |  |  |  |
| Lens element 43 | concave concave |  |  |  |  |
| Lens element 44 | concave convex | Asphere | 6.99E−11 | 1.81E−14 | 4.32E−18 |

The involved optical surfaces of the relay optical unit 40 are designated in the first column of table 1, beginning with an object plane that coincides with the arrangement plane 45 in the case of the aligned illumination optical unit 7. In the first column the involved optical surfaces of the lens elements 41 to 44 follow in the order of the beam path.

Table 1 reveals that the distance D between the arrangement plane 45 and the entrance surface of the first lens element 41 is more than 275 mm. A different distance, for example of at least 50 mm, at least 100 mm, at least 150 mm, at least 200 mm or at least 250 mm, can also be present depending on the design of the relay optical unit 40.

Radii values of the optical surfaces of the lens elements 41 to 44 are indicated in the second column of table 1.

In each case the distance between the plane or surface considered and the respectively succeeding surface or plane is indicated in the third column of table 1. The next column of table 1 gives indications of the material of the lens elements 41 to 44.

The first column of table 2 once again denotes the assignment of the surfaces involved, listed in the order of the beam path as in table 1 with regard to the lens elements 41 to 44. The next column of table 2 indicates whether the surface respectively considered is convex or concave. Apart from the first entrance surface and the last exit surface, which are convex in each case, all the optical surfaces of the lens elements 41 to 44 are concave.

The lens elements 41 and 44 are embodied as aspherical lens elements. The last columns of table 2 indicate, for the aspherical lens elements, coefficients κ and c1 to c4 in accordance with the following aspheric equation:

$$z = \frac{\rho h^2}{1 + \sqrt{1 - (1+\kappa)\rho^2 h^2}} + \sum_{k=1} c_k h^{2k+2}$$

The designations here have the following meanings:
z: Sagittal height;
h: Distance from the lens element vertex, that is to say with respect to the optical axis;
κ: conic constant;
ρ: 1/radius Details concerning the material CAF2HL can be found in WO 2008/071275 A1.

In one variant of the illumination optical unit, a random phase element (RPE) 46 is arranged upstream of the optical hollow waveguide component 31, the random phase element being indicated in a dashed manner in FIG. 2. The RPE 46 ensures that no disturbing interference of the illumination light 8 occurs in the region of the beam exit surface 35. The RPE 46 is embodied as a plate composed of optical material, for example composed of CaF2 or CAF2HL. The RPE is subdivided, over its area used for the passage of the illumination light 8, into a plurality of regions of different thicknesses, that is to say of different optical path length for the illumination light 8. Each region is delimited per se by plane-parallel entrance and exit surfaces of the RPE 46. Transitions between the regions of different optical path length are stepped. The associated thickness differences Δz, that is to say the step sizes, are random. Δz is between 0 and $\lambda/2\, (n_{RPE} - n_0)$. In this case, λ is the operating wavelength of the illumination light 8, $n_{RPE}$ is the refractive index of the optical material of the RPE 46 and no is the refractive index of the optically less dense medium, for example of air. The random thickness differences Δz thus make it possible to generate phase differences during passage through the RPE 46 in the range of between 0 and λ/2.

The regions of the RPE 46 with constant thickness can be arranged in a gridlike manner, particularly in a checkered fashion. An area extent of the regions of constant thickness is chosen such that a lateral mode extent at the RPE 46 always covers a plurality of these regions of constant thickness, for example five regions of this type. A lateral mode thus always experiences regional phase differences. On account of the random distribution of the regions of constant thickness of the RPE 46, the interference pattern of each mode differs from the interference pattern of another mode. The sensitivity of the homogeneity of the illumination particularly with regard to mode instabilities of the primary light source 6 is thereby reduced.

The RPE 46 is arranged at a position in the beam path of the illumination optical unit 7 at which the modes of the primary light source 6 are separated in the position space. The RPE 46 can be arranged in a plane that is conjugate with respect to the primary light source 6. In order that this is ensured, an optical unit (not illustrated in more specific detail) between the primary light source 6 and the RPE 46 ensures that the arrangement plane of the RPE 46 is conjugate with respect to the primary light source 6.

For the microlithographic production of microstructured or nanostructured components using the projection exposure apparatus 1, firstly a substrate or a wafer is provided in the wafer plane 27. A layer composed of a light-sensitive material is at least partly applied on the wafer. Furthermore, a reticle having structures to be imaged is provided in the reticle plane 4. The projection exposure apparatus 1 is then used to project the portion of the reticle arranged in the object field 3 onto a region of the layer arranged in the image field.

The invention claimed is:
1. An illumination optical unit configured to guide illumination light along a path toward an object field, the illumination optical unit comprising:
   an input coupling optical unit;
   a hollow waveguide component downstream of the input coupling optical unit along the path;
   a random phase element upstream of the input coupling optical unit along the path;
   a relay optical unit downstream of the hollow waveguide component along the path; and
   a mirror array downstream of the relay optical unit along the path,
   wherein:
      the mirror array comprises a multiplicity of individual mirrors which are tiltable independently of each other;

the input coupling optical unit is configured to couple a beam of the illumination light into the hollow waveguide component;

the relay optical unit is configured to image a beam exit surface of the hollow waveguide component onto the mirror array; and the hollow optical waveguide component is configured to homogenize and stabilize a beam of the illumination light incident on the mirror array.

2. The illumination optical unit of claim 1, wherein the illumination optical unit is configured so that an internal reflection angle of the illumination light in the hollow waveguide component is greater than 85°.

3. The illumination optical unit of claim 2, wherein the hollow waveguide component has a ratio of waveguide length to waveguide cross section of at least 100.

4. The illumination optical unit of claim 3, wherein the hollow waveguide component has a cavity with a rectangular waveguide cross section.

5. The illumination optical unit of claim 4, wherein the hollow waveguide component comprises at least two separate component parts combined so that each component part delimits at least one internal reflection surface of the hollow waveguide component.

6. The illumination optical unit of claim 1, wherein the hollow waveguide component has a ratio of waveguide length to waveguide cross section of at least 100.

7. The illumination optical unit of claim 1, wherein the hollow waveguide component has a cavity with a rectangular waveguide cross section.

8. The illumination optical unit of claim 1, wherein the hollow waveguide component comprises at least two separate component parts combined so that each component part delimits at least one internal reflection surface of the hollow waveguide component.

9. The illumination optical unit of claim 8, wherein the hollow waveguide component comprises four separate component parts combined so that each component part delimits at least one internal reflection surface of the hollow waveguide component.

10. The illumination optical unit of claim 9, wherein the hollow waveguide component comprises four at least partly reflectively coated mirror parallelepipeds.

11. The illumination optical unit of claim 1, wherein the hollow waveguide component comprises at least partly reflectively coated mirror parallelepipeds.

12. The illumination optical unit of claim 1, wherein the relay optical unit has a magnifying imaging scale of at least 10.

13. The illumination optical unit of claim 1, wherein the relay optical unit comprises more than one lens element.

14. The illumination optical unit of claim 1, further comprising a plurality of actuators configured to tilt the individual mirrors.

15. An optical system, comprising:
an illumination optical unit according to claim 1; and
a projection optical unit configured to image the object field into an image field in an image plane.

16. An illumination system, comprising:
an illumination optical unit according to claim 1; and
a light source configured to generate generating the illumination light.

17. An apparatus, comprising:
an optical system, comprising:
an illumination optical unit according to claim 1; and
a projection optical unit configured to image the object field into an image field in an image plane; and
a light source configured to generate generating the illumination light,
wherein the apparatus is a projection exposure apparatus.

18. A method of using a projection exposure apparatus comprising an illumination optical unit and a projection optical unit, the method comprising:
using the illumination optical unit to illuminate at least some structures of a reticle in an object plane of the projection exposure apparatus; and
using the projection optical unit to project at least a portion of the illuminated structures of the reticle onto a light-sensitive material in an image plane of the projection exposure apparatus,
wherein the illumination optical unit comprises an illumination optical unit according to claim 1.

19. An illumination optical unit configured to guide illumination light along a path toward an object field, the illumination optical unit comprising:
an input coupling optical unit;
a hollow waveguide component;
a random phase element upstream of the input coupling optical unit along the path;
a relay optical unit; and
a mirror array,
wherein:
the mirror array comprises a multiplicity of mirrors;
the input coupling optical unit is configured to couple a beam of the illumination light into the hollow waveguide component;
the relay optical unit is configured to image a beam exit surface of the hollow waveguide component onto the mirror array; and
the hollow optical waveguide component is configured to homogenize and stabilize a beam of the illumination light incident on the mirror array.

20. An illumination optical unit configured to guide illumination light along a path toward an object field, the illumination optical unit comprising:
an input coupling optical unit;
a hollow waveguide component;
a random phase element upstream of the input coupling unit along the path; and
a mirror array,
wherein:
the mirror array comprises a multiplicity of mirrors;
the input coupling optical unit is configured to couple a beam of the illumination light into the hollow waveguide component; and
the hollow optical waveguide component is configured to homogenize and stabilize a beam of the illumination light incident on the mirror array.

21. The illumination optical unit of claim 1, wherein:
the random phase element comprises a plurality of each regions;
each region comprises a plane parallel entrance surface, a plane parallel exit surface, and a thickness between its plane parallel entrance surface and its plane parallel exit surface; and
the thickness of different regions is different so that the transition between different regions is stepped.

22. The illumination optical unit of claim 20, wherein:
the random phase element comprises a plurality of each regions;
each region comprises a plane parallel entrance surface, a plane parallel exit surface, and a thickness between its plane parallel entrance surface and its plane parallel exit surface; and the thickness of different regions is different so that the transition between different regions is stepped.

23. The illumination optical unit of claim 19, wherein:
the random phase element comprises a plurality of each regions;
each region comprises a plane parallel entrance surface, a plane parallel exit surface, and a thickness between its plane parallel entrance surface and its plane parallel exit surface; and
the thickness of different regions is different so that the transition between different regions is stepped.

\* \* \* \* \*

UNITED STATES PATENT AND TRADEMARK OFFICE
CERTIFICATE OF CORRECTION

| | |
|---|---|
| PATENT NO. | : 10,151,929 B2 |
| APPLICATION NO. | : 15/385289 |
| DATED | : December 11, 2018 |
| INVENTOR(S) | : Markus Deguenther and Thomas Stammler |

Page 1 of 1

It is certified that error appears in the above-identified patent and that said Letters Patent is hereby corrected as shown below:

In the Specification

Column 8, Line 42, delete "Entrrance" and insert -- Entrance --.

Column 10, Line 12, delete "no" and insert -- $n_0$ --.

Signed and Sealed this
Sixteenth Day of April, 2019

Andrei Iancu
*Director of the United States Patent and Trademark Office*